United States Patent
Richardson et al.

(10) Patent No.: US 6,377,651 B1
(45) Date of Patent: Apr. 23, 2002

(54) LASER PLASMA SOURCE FOR EXTREME ULTRAVIOLET LITHOGRAPHY USING A WATER DROPLET TARGET

(75) Inventors: Martin Richardson, Geneva, FL (US); Guido Shriever, Göttingen (DE)

(73) Assignee: University of Central Florida, Orlando, FL (US)

(*) Notice: Subject to any disclaimer, the term of this patent is extended or adjusted under 35 U.S.C. 154(b) by 0 days.

(21) Appl. No.: 09/685,291

(22) Filed: Oct. 10, 2000

Related U.S. Application Data

(60) Provisional application No. 60/158,723, filed on Oct. 11, 1999.

(51) Int. Cl.[7] .................................................. G21K 5/00
(52) U.S. Cl. ........................................... 378/34; 378/119
(58) Field of Search .......................... 378/34, 119, 143, 378/120, 123; 250/251

(56) References Cited

U.S. PATENT DOCUMENTS

| | | | | |
|---|---|---|---|---|
| 5,151,928 A | | 9/1992 | Hirose ........................ | 378/119 |
| 5,459,771 A | | 10/1995 | Richardson et al. ........ | 378/119 |
| 5,577,091 A | | 11/1996 | Richardson et al. ........ | 378/119 |
| 5,577,092 A | * | 11/1996 | Kublak et al. ............... | 378/119 |
| 5,691,537 A | * | 11/1997 | Chen et al. .................. | 250/251 |
| 5,991,360 A | * | 11/1999 | Matsui et al. ............... | 378/119 |

FOREIGN PATENT DOCUMENTS

WO  PCT/SE97/00697  4/1997

OTHER PUBLICATIONS

Richardson, Silfvast, Bender, Hanzo, Yanovsky, Jin, Thorpe, Characterization and Control of Laser Plasma Flux Parameters for Soft X–ray Projection Lithograph, Optical Society F America, 1993, vol. 32, No. 34 Applied Optics.

* cited by examiner

Primary Examiner—Robert H. Kim
Assistant Examiner—Irakli Kiknadze
(74) Attorney, Agent, or Firm—Brian S. Steinberger; Law Offices of Brian S. Steinberger, P.A.

(57) ABSTRACT

A laser produced extreme ultraviolet (EUV) source based on a water droplet target has been implemented an auxiliary electrode system between the source and the first collector mirror. The auxiliary electrode system creates a repeller electric field, possibly a dc voltage imposed on the mirror that slows down and reverses the trajectories of ions from the source before they impact the collection mirror. The source modified according to the invention was evaluated with respect to the demands of EUV lithography and found to have much extended operational lifetimes. The spectral distribution of the generated radiation as well as the conversion efficiency into line radiation at 13 nm was determined. Long time measurements of the reflectivity of silicon/molybdenum multilayer mirrors for up to from $10^7$ to $10^9$ shots show the useful influence of the treatment of ions emitted from the source. Several methods of debris reduction were tested and discussed. Surface analysis of the treated multilayer mirrors of is presented. Long time measurements of the reflectivity of silicon/molybdenum multilayer mirrors for up to $10^9$ shots show the advantage provided by this invention.

18 Claims, 9 Drawing Sheets

LASER PLASMA SOURCE FOR EXTREME ULTRAVIOLET LITHOGRAPHY USING A WATER DROPLET TARGET

This invention relates to lasers, and in particular to an ice water target source for laser plasma soft-x-ray or EUV projection lithography having an increased operational lifetime, and claims the benefit of priority to U.S. Provisional Application No. 60/158,723 filed Oct. 11, 1999.

BACKGROUND AND PRIOR ART

For soft x-ray or EUV projection lithography there is a need for a high repetition-rate laser plasma source that can radiate at a specific wavelengths in the EUV part of the spectrum and capable of operating at approximately 1200 Hz. The wavelength of the EUV radiation must correspond to the peak reflectivity of the precision multilayer coated reflective optics utilized in this approach. At the present time the wavelengths of choice are 13 nm and 11.7 nm, but in the future other wavelengths may be preferable. This type of source should comprise a compact high repetition-rate laser and a renewable target system capable of operating for prolonged periods of time. For a production line facility, there would need to be uninterrupted system operation for periods of approximately 3 months. That is, uninterrupted operation for some 109 shots. To make the irradiation system cost effective, current system cost scenarios indicate the unit shot material cost must be in the vicinity of ?10–6 per shot. Target sources for laser plasma soft-x-ray projection lithography have encompassed several systems such as tape driven targets and solid targets and frozen gases which all have inherent problems.

In a December 1993 publication, M. Richardson, W. T. Silfvast, H. A. Bender, A. Hanzo, V. P. Yanovsky, F. Jin, J. Thorpe, "Characterization and control of laser plasma flux parameters for soft-x-ray projection lithography", Appl. Optics 32, 6901–6910 (1993), there is included a characterization of plasma particulate emissions and suggestions for reducing the fluxes impact on optical components including: use of a background gas of helium (page 6907, first column); use of spinning apertures (page 6908, first column); use of pulsed gas jets to deflect the particles (page 6908); use of magnetic deflection of the particles after charged with an high-current electronic beam (page 6908); and, laser light ablation of particles to deflect the particles (page 6908). None of these approaches have been found useful in the 17 or more years since that time.

In U.S. Pat. No. 5,151,928 to Hirose discloses a system, which uses film type tapes as a target source. However, tape driven targets are limited mass targets that are difficult to construct, prone to breakage and produce low velocity debris that can damage the other components such as the mirrors in the laser output system. Furthermore, using and replacing the tapes is generally cumbersome and costly.

Solid targets also have many problems. Known solid target sources include rotating solid wheels of Sn or tin, or copper or gold or other materials. These sources inherently can produce various ballistic particles types that can emanate from the plasma in various directions. When using tin as the target the interaction of the laser light with the plasma, causes highly stripped, energetic ions to be formed by collision ionization. These ions can stream ballistically from the plasma region with velocities of between $10^6$ and $10^7$ centimeters per second. Furthermore, after the interaction of the plasma and the tin target, hot clumps or clusters of target material are boiled off of the target. These materials have been determined to be another form of debris particles that can have velocities in the range of 200 to 2500 centimeters per second. The sizes of these particles range from less than 1 to greater than 200 micrometers. These larger particles can cause cold particle cratering on many of the components used to construct visible and x-ray optical components such as the mirrors and are capable of puncturing thin-fill x-ray filters. All of these debris size particles can degrade the surface quality or the operating performance by over coating the optical elements in the laser output system. Likewise, other solid targets besides tin can produce similar debris type particles.

In summary, since the development of Extreme Ultraviolet Lithography (EUVL) is the leading technology to replace optical lithography, there is a common requirement that there be no collateral particulate emission from the plasma. This leads to the liquid droplet source disclosed in U.S. Pat. Nos. 5,459,771 and 5,577,091 as a bright source in the soft x-rays and EUV radiation of 13 nm and 11.6 nm radiation. Unfortunately, it has been found that with extended life ($>10^7$ shots), ions from this plasma still sputter or ablate the surface layers of the multi-layer EUV lithography optical systems.

SUMMARY OF THE INVENTION

The first objective of the present invention is to provide an inexpensive, sequencing target system as a laser plasma x-ray source having an increased operational lifetime.

The second object of this invention is to provide a target system that prevents ions hitting the collector mirror or associated components of a lithographic system by the use of a repeller electric field structure.

The third object of this invention is to provide a laser plasma target source that can operate at a frequency of approximately 1000 Hz to 100 kHz for an extended operational lifetime.

The fourth object of this invention is to provide a laser plasma target source for lithographic applications that can operate continuously for an extended operational period of more than $10^7$ shots, and extending beyond that currently needed for an operating lithographic tool.

In a preferred embodiment, a pulse based EUV light source based on laser plasmas produced from a train of microscopic water droplets comprising: an EUV light source; a first collector EUV mirror; and an auxiliary electrode system, preferably a dc potential imposed on said mirror, which provides a repeller field that slows down and reverses the trajectory of ions from said source before they impact the collection mirror.

Further objects and advantages of this invention will be apparent from the following detailed description of a presently preferred embodiment, which is illustrated schematically in the accompanying drawings and illustrated comparative data showing the surprising operational lifetime of the embodiment and the method employed therein.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

PREFERRED EMBODIMENT OF THE INVENTION

Figure 1:
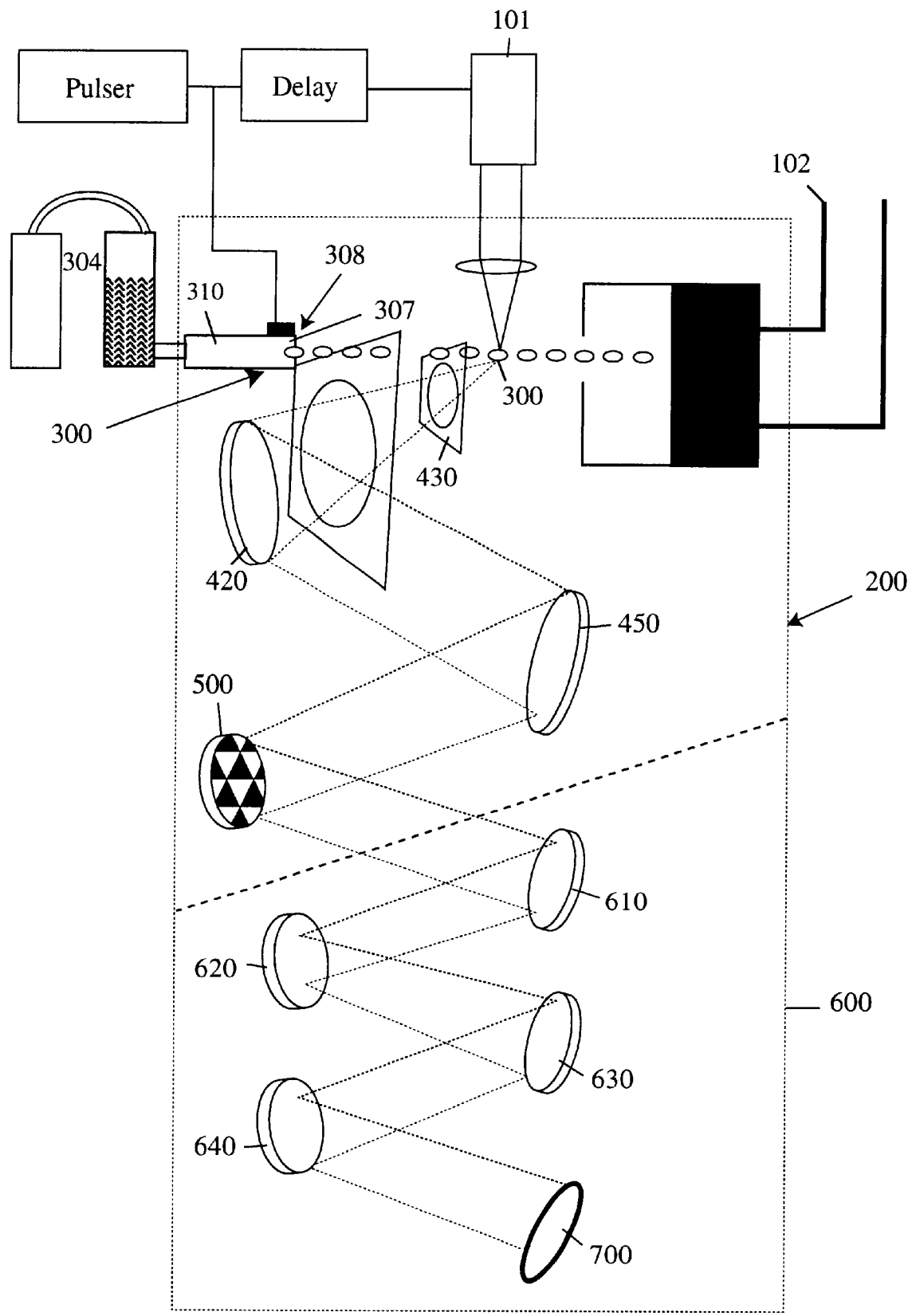
FIG. 1 illustrates the EUV Lithography system using the water laser x-ray plasma source.
Figure 1A:
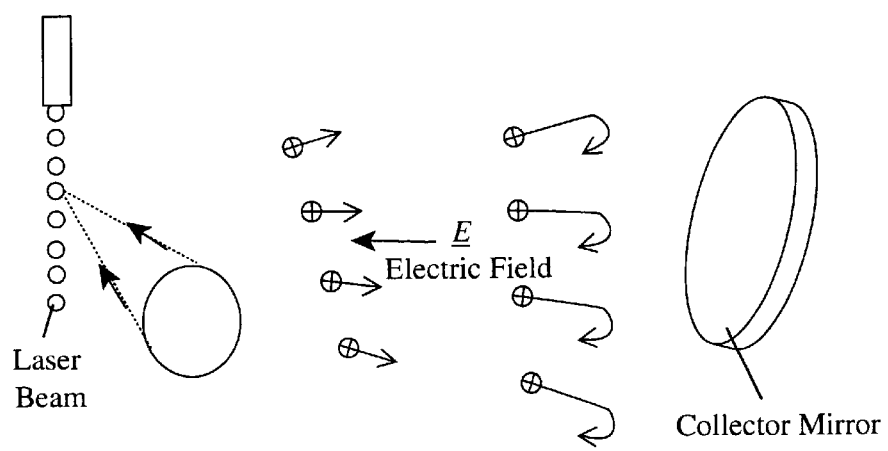

Before explaining the disclosed embodiment of the present invention in detail, it is to be understood that the invention is not limited in its application to the details of the particular arrangement shown since the invention is capable of other embodiments. Also, the terminology used herein is for the purpose of description and not of limitation. The substance of this invention which provides for a marked increase in the operational lifetime of EUV lasers in the production of lithographs is the introduction of an auxiliary electrode system which provides a repeller field that slows down and reverses the trajectory of ions from the laser beam source before they impact the collection mirror. The auxiliary electrode system can be of the form shown in FIG. 1 The general requirement of the ion repeller approach is that an electric field is inserted between the source of the ions and the collection mirror [FIG. 1a], sufficient to repel the initial trajectory of the ions. The application of this field may be accomplished with several configurations: some but not all are shown in FIG. 1.

Figure 1B:
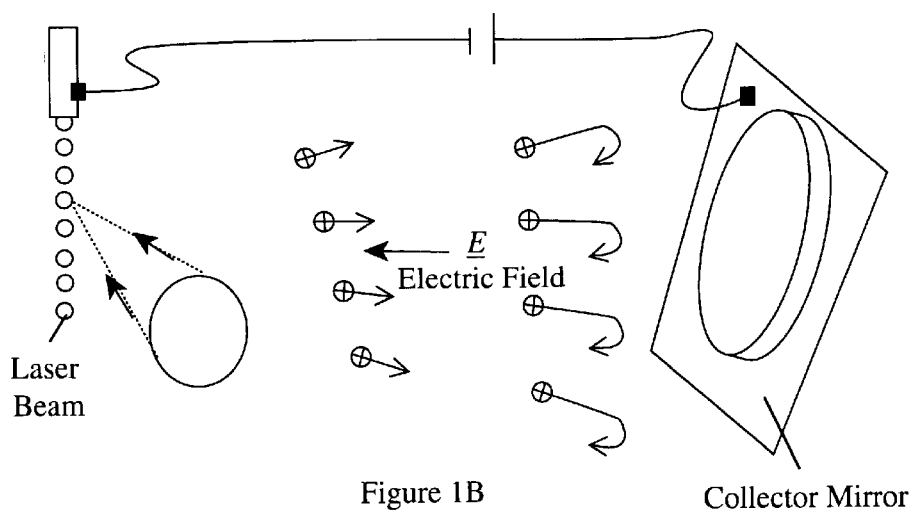

The simplest configuration involves the application of a DC field between the target and the collector mirror, [FIG. 1b]. This approach was demonstrated in the present claim. This can be achieved by applying a positive voltage to the mirror or mirror support, and/or a negative voltage to the target system.

Figure 1C:
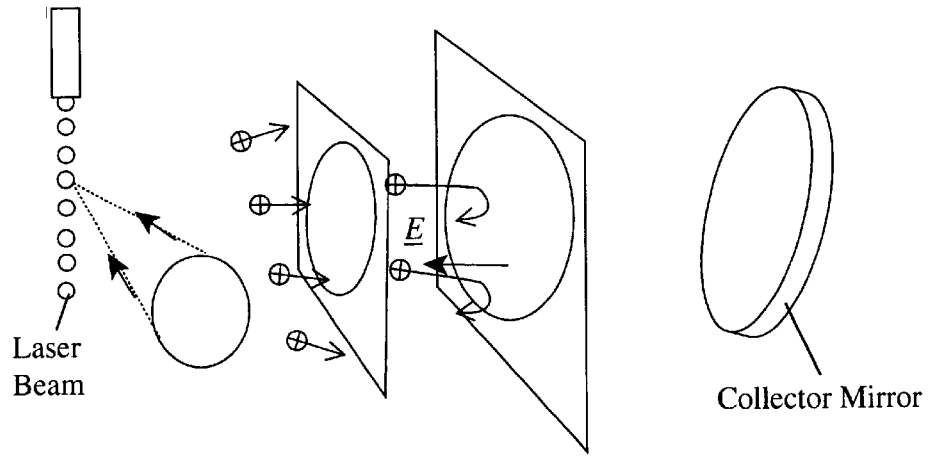

Alternatively, a region of high electric field can be created between two separate electrodes as shown in FIG. 1c.

Figure 1D:
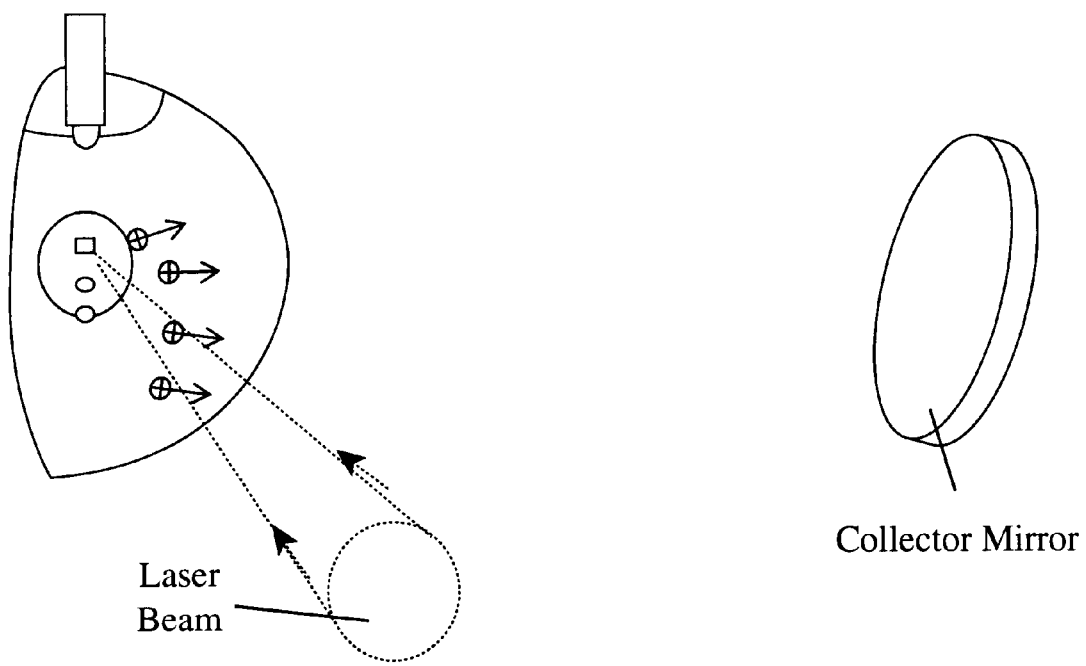

Another configuration is shown in FIG. 1d. In this approach the target can be enclosed by a charged ultrathin wire mesh. This transparent mesh would be made of wire of thickness smaller than the EUV target dimensions [<10 microns]. Under these conditions the mesh would not create a shadow of itself on the collector mirror. The EUV emission would only be reduced by the obscuration [1-transmission] of the mesh, which can be a only a few percent. The charged mesh would capture the ions. More than one mesh could be used to increase the protection of the collector mirror.

The field applied be high enough to capture or repel the ions. In the test performed, a voltage of ~100 V was applied. This was estimated to be comparable to the energy of the ions (~60 eV), emanating from the plasma. However, higher fields can also be applied, and may be more effective.

The repeller field can usefully be positioned in a supporting system which can further slow down the oxygen or other ions from the laser source. Such a system is: an atmosphere of helium at a pressure of about 0.2 Torr. Helium has the advantage that it has the highest transmission to EUV radiation, but other gases ( Ar, N, Xe, $SF_6$...) could be used.

FIG. 1 illustrates an overview of a EUV Lithography system using the water laser x-ray plasma system fully disclosed in U.S. Pat. Nos. 5,459,771 and 5,577,091 of common assignee with this application and incorporated herein by reference thereto. FIG. 1 further includes the modification of an auxiliary electrode system according to the instant invention.

The EUV lithography system 100 of FIG. 1 uses the water laser x-ray plasma source 300. The laser beam source 101 used to irradiate the EUV target can be a high repetition rate Nd:Yag or KrF examer laser. 200 indicates the vacuum enclosure for the laser plasma target. Element 300 refers to the apparatus that continuously creates replenishable target material 320 for each laser shot, such as ice droplets. Element 420 is a first EUV collector mirror which can be spherical in overall shape or have a spherical surface. The surface of this mirror can be coated with special multilayer structures to provide high reflectivity at near-normal incidence at selected EUV wavelengths such as 11.7 nm, 13 nm, and so on. The electrode system is fabricated so as to provide a repeller field 430 between the face of mirror element 420 and the water laser x-ray plasma source 300. The repeller field 430 slows down and reverses the trajectories of ions from the source 300 before they impact the face of the collection mirror 420.

Element 450 is a second multilayered coated EUV collector mirror. Although not shown, alternatively a third or more multilayered coated EUV collector mirrors can be incorporated into the system. If desired to potentially further increase the operational lifetime of the lithography system, repeller fields 430 can be introduced in front of any successive EUV collector mirror such as element 450. 500 refer to a specially fabricated mask structure having reflecting surfaces comprising a structure pattern to be imaged onto the wafer 700. Elements 610, 620, 630 and 640 refer to various other spherical reflective components well known to be used in an optical system of high precision that are capable of imaging reflection mask 500 to wafer 700. Elements 610, 620, 630 and 640 can further be coated with multilayer EUV normal incidence coatings for preselected wavelengths to be used in the system. Enclosure 600 denotes a separate vacuum enclosure for housing components 610, 620, 630 and 640 of the imaging system. Alternatively, enclosure 600 can contain a low background gas such as He. Finally element 700 is a lithographic wafer comprising an EUV sensitive resist on a semiconductor substrate.

In operation an optical laser beam 102 is emitted from source 101 striking target 320. Radiation 400 in the form of EUV and/or x-rays from the laser plasma source generated from target 300 are collected at mirror 420 and subsequently focused via mirrors 450 onto mask 500 which subsequently reflects a preselected pattern via mirrors 610 to 640 to water 700.

A source supply of basic laser target material such as a pressurized water tank 304 can supply water to injector 310 either as a continuous stream of water under pressure, or as a vapor or steam that is subsequently frozen by freezer means 308. The components of apparatus 300 can be housed in a vacuum enclosure 302. Means 308 freezes the steam from tube 305 into frozen pellets 320 of ice crystals or snow. These frozen pellets of ice can be formed by passing the droplets through a single metallic tube 307 that has been thermo-electrically cooled or chilled by liquid Nitrogen having an approximate temperature of minus 77 degrees centigrade. Alternatively, element 307 can comprise concentric metallic tubes where the area between the inner and outer tubes includes cold liquid helium of approximately minus 260 degrees centigrade. An additional freezing technique can be accomplished by the inherent freezing that can take place within the vacuum chamber 302. In the latter technique small droplets of water injected into a vacuum will freeze due to rapid evaporation from the surface of the droplet. Under this technique approximately 10% of the mass of a 100 ngm water droplet will be lost to evaporation before the droplet freezes.

Element 310 represents a nozzle jet device for projecting crystals into the path of laser beam 102. High repetition rate liquid-droplet injectors with nozzle jets such as those described in U.S. Pat. Nos., 5,126,755 and 5,142,297, which are incorporated by reference, can be utilized to project the frozen water droplets 320. Although these patents describe specific embodiments of ink jet systems, the laser plasma target system disclosed in this application can utilize any type of ink jet type droplet injectors, so long as the droplet size can be made to approximate 50 to 200 ngm in mass.

In the example described herein, water from a small tank is pumped through a glass capillary with 10 microns in diameter. This nozzle is vibrated by a piezoelectric crystal driven by a pulse generator. The water pressure in the experiments is usually 1200 kPa. Stable conditions were achieved using constant pressure from a nitrogen gas tank. A rotary pump used earlier caused fluctuations in the water pressure, which resulted in unstable velocities and distances of the droplets. For the droplet detection a focused helium-neon laser and a photodiode were used. A droplet passing the focus point of the HeNe beam causes a shadow on the photodiode behind and a dip in the signal.

Figure 2:
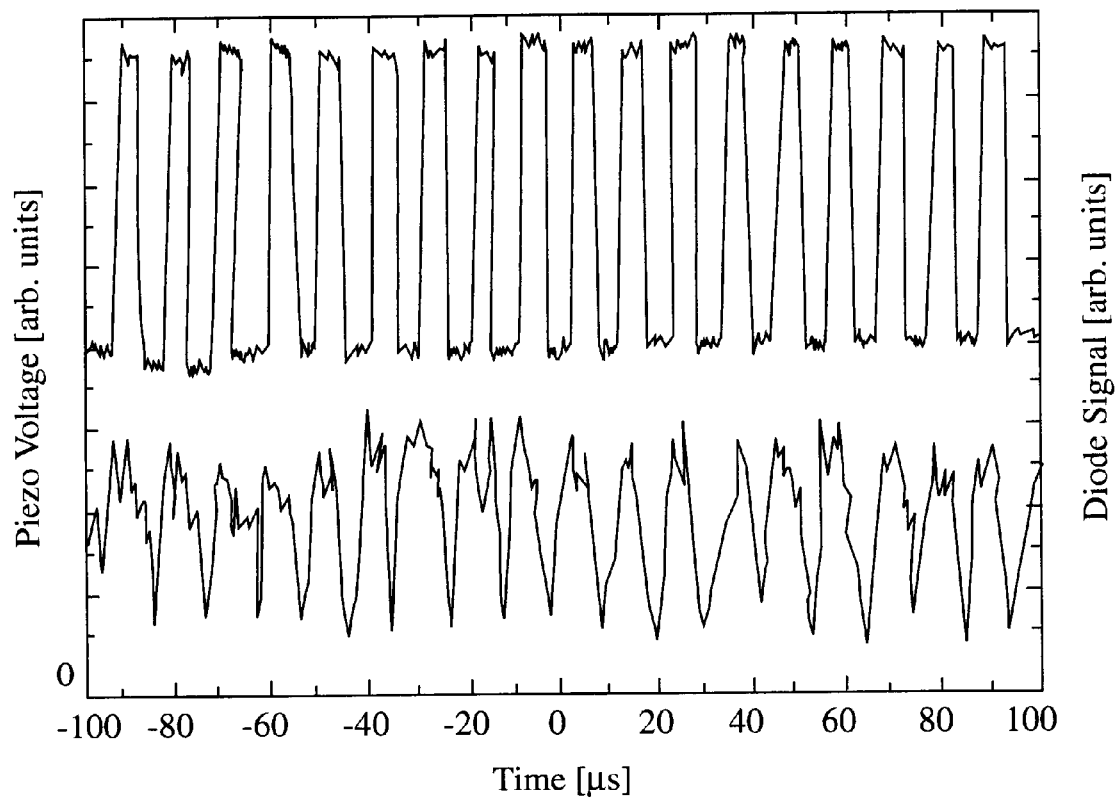
FIG. 2 shows the output of the plasma source resulting from stabilization of the operating conditions before each experiment.

Water pressure and driving frequency of the piezoelectric crystal need to be adapted to each other for stable conditions before each experiment. Reference should now be made to FIG. 2 which shows how stability of droplet generation is controlled with the droplet detection system. The signal from the pulse generator (up) has the same frequency compared to the droplets (down). Typically driving frequencies were found in the range of 20 kHz<f<100 kHz. This results in droplet diameters between 40 $\mu$m and 80 $\mu$m and velocities of about 10 m/s at a water flow of 0.2 ml/min or 300 ml/day.

The laser system used for the presented experimental data is a flash lamp pumped with a Nd:YAG laser. The emitted radiation with 1064 nm wavelength is pulsed by a Q-switch. The laser pulses have energies of 250 mJ and a pulse length of 10 ns. The maximum repetition rate is 100 Hz. The laser radiation is focused with a lens of 50 mm focal length to a focus spot with a diameter of 25 $\mu$m and intensities of $4 \times 10^{12}$ W/cm$^2$.

The pulse generator signal driving the pilectric crystal also drives the Q-switch trigger of the laser. Both pulses are related by an adjustable delay. By setting this delay and aligning the droplet jet to the laser focus point using an XYZ translation stage, single droplets are hit by the pulsed laser radiation in the focal plane.

The laser repetition rate is much smaller than the droplet frequency. Most of the droplets are remain unused and need to be cooled down to cryogenic temperatures to decrease the vapor pressure of the water inside the vacuum chamber. For this a trap cooled by liquid nitrogen was utilized. Growing ice tips on the trap are chopped off by a mechanical chopper. In combination with a turbo pump the pressure is kept between 1 and 3 Pa during the experiments for several hours.

SPECTRAL ANALYTIC

Figure 3:
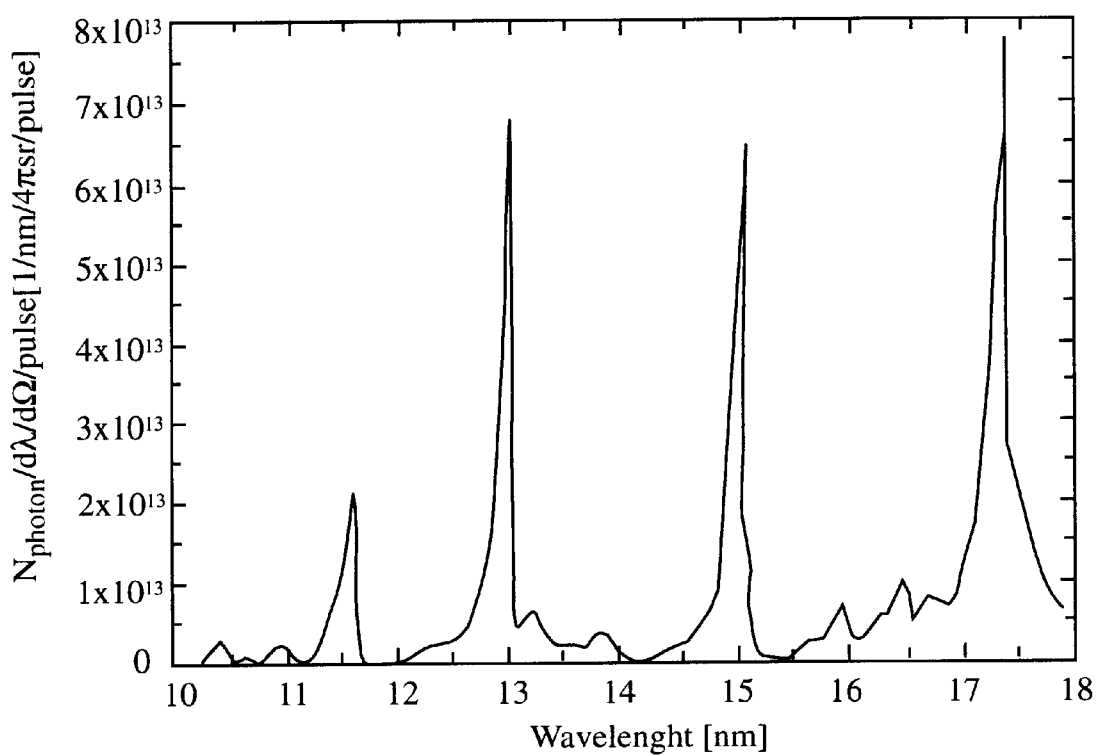
FIG. 3 showray spectroscopic data observed from radiation emitted from laser produced water plasma.

The emitted radiation from the laser produced water plasma is analyzed by a flat field grazing incidence spectrograph in combination with a thinned, back illuminated charge coupled device camera. Radiation from lithium-like oxygen is observed around 13 nm wavelength. Reference should be made to FIG. 3 which shows the emission spectrum of the laser produced water plasma in the EUV range at a laser intensity of $4 \times 10^{12}$ W/cm$^2$.

Figure 4:
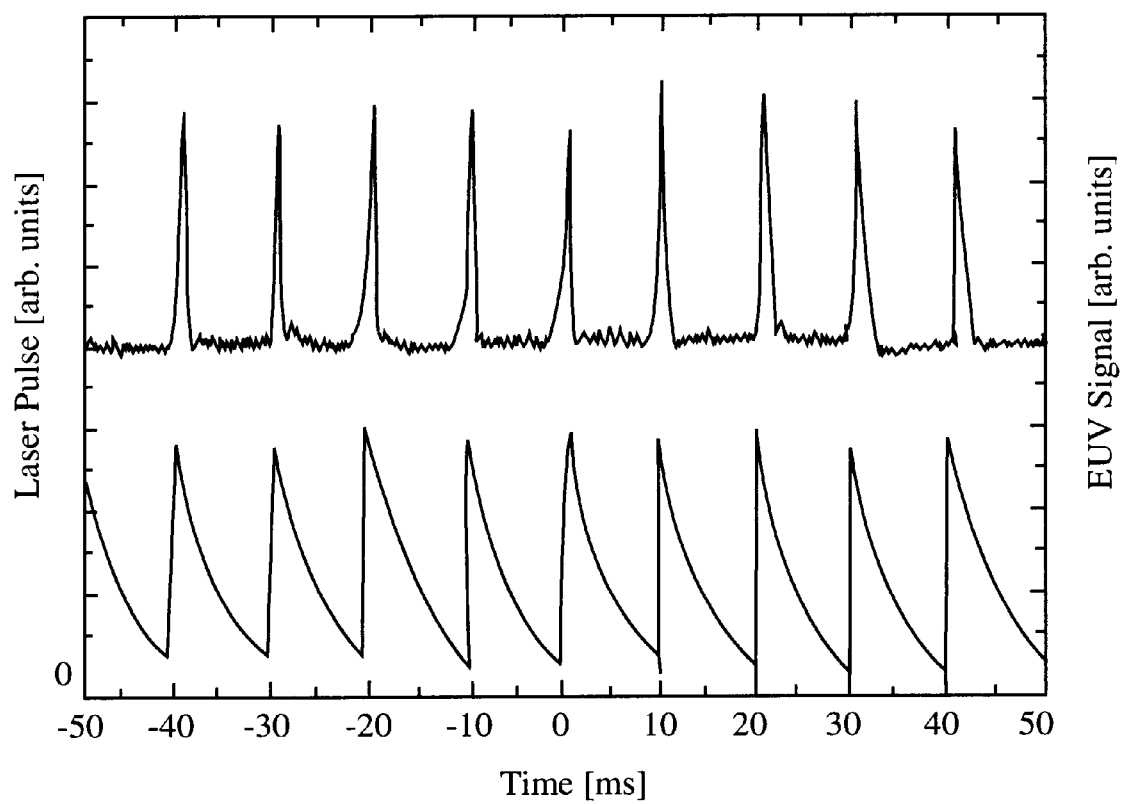
FIG. 4 shows the pulse-to-pulse stability of the 13 nm emission from the laser produced water plasma.

Line radiation from higher ionized oxygen is not detected from the plasma. The used intensity of the laser radiation is well suited for effective generation of lithium-like oxygen ions. The conversion efficiency measured for line radiation with 13 nm wavelength in relation to the laser pulse energy is measured to 0.63%/4$\pi$sr. This is in agreement to literature values of 0.56%/4$\pi$sr achieved with a comparable laser system using a bulk water target. For this comparison the published data were extrapolated to a comparable laser intensity. For this a calibrated multilayer mirror, a calibrated niobium filter with 170 nm thickness and literature data for the responsivity of the photodiode are used. With this setup only radiation with 13 nm wavelengths is detected by the diode. The pulse-to-pulse stability of the emission is shown in FIG. 4 where pulse to pulse stability of the laser pulse signal (up) and the EUV signal (down) is presented. The jitter of the laser pulse signal height is caused by digitizing of the short signal on the long time scale.

The pulse widths of the signals are elongated electronically to make them visible on the millisecond time scale. Long time stability for several minutes or hours needs realignment of the system every few minutes, this problem can be solved by a close-loop control system for the alignment.

Reflectivity Measurements

The reflectivities of the multilayer mirrors are controlled by detecting the intensity of radiation with 13 nm wavelength behind the mirror. The detector is a photodiode in combination with a free standing filter or a coated photodiode. These filters are necessary to reduce the visible light on the diode and to avoid scattered light contributions to the signal. During the experiments the laser is running with 100 Hz repetition rate and data are taken every five minutes or every $3 \times 10^4$ shots. The distance is 32 mm between the radiation source and the mirror. In a real EUV lithography system the gap between source and mirror is about 200 mm. Comparing only the solid angles the observed effects should appear after an about 50 times higher number of pulses.

Figure 5:
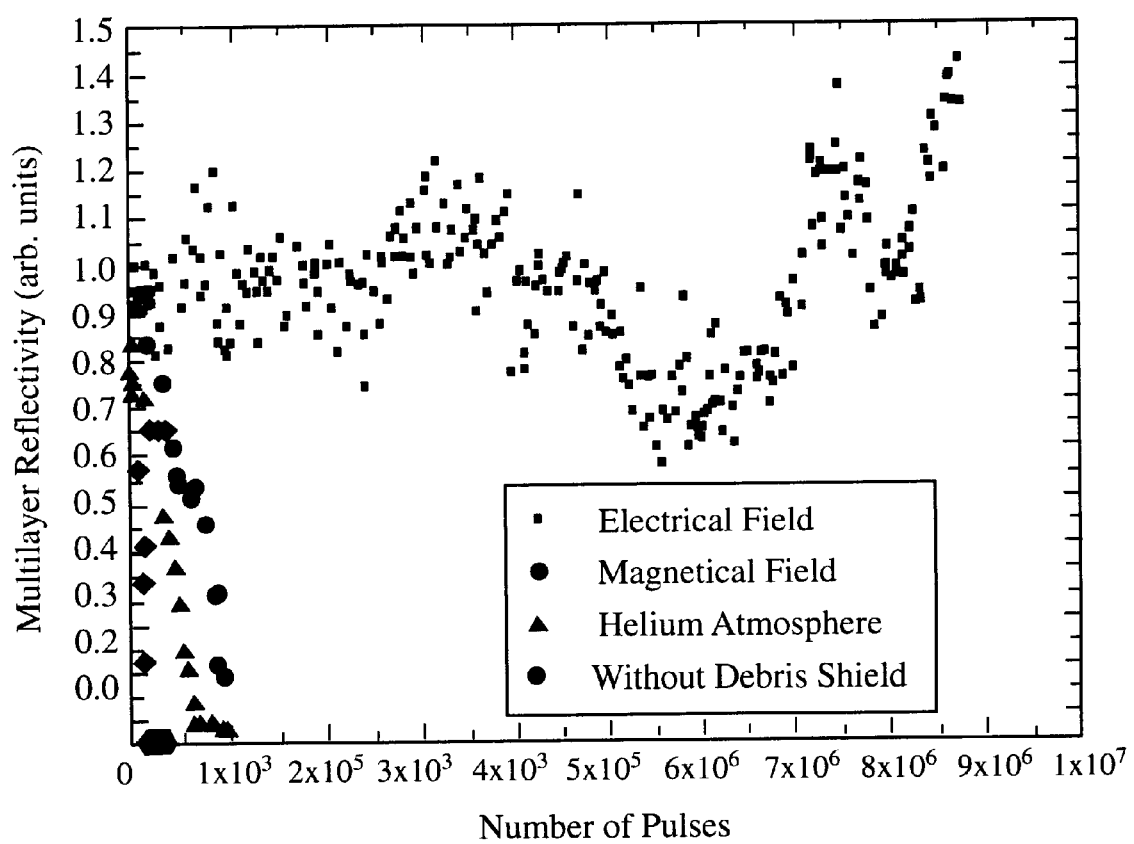
FIG. 5 shows the reflectivity of multilayer mirrors in dependence on the number of laser pulses.

FIG. 5 shows the reflectivity of multilayer mirrors in dependence on the number of laser pulses. The multilayer mirrors in the subsequently described experiments in a) to c) have 10 bilayers whereas the sample in case d) has 30 periods. The results are compared using a magnetic field, a helium gas atmosphere and a repeller field to the result obtained using no debris shield.

a) No Debris Shield

Using no technique to reduce the debris the multilayer reflectivity is decreased to about zero after $7 \times 10^5$ pulses. This decrease of reflectivity is nearly linear in dependence on the number of pulses. Visual analysis of the multilayer sample shows alternating dark and light stripes on the surface of the treated mirror. Close to the source the bilayers are sputtered off from the silicon substrate. Behind a beam-stop the mirror is untreated. In the transition region the alternating layers of molybdenum and silicon are visible.

b) Magnetic Field

Installing two permanent magnets with unknown field strength between the source and the mirror results in a smaller gradient of the decreasing reflectivity compared to case a). The reflectivity curve can be extrapolated linearly to reach about zero after $1.2 \times 10^6$ pulses. The ions are partly deviated by the magnetic field. A smaller number of ions reach the mirror and the sputter speed is reduced. The large solid angle used to collect the radiation avoids the installation of a magnetic field with larger strength because of room problems. Visual control of the multilayer sample shows the same effect as described in case a).

c) Helium Gas Atmosphere

Figure 6:
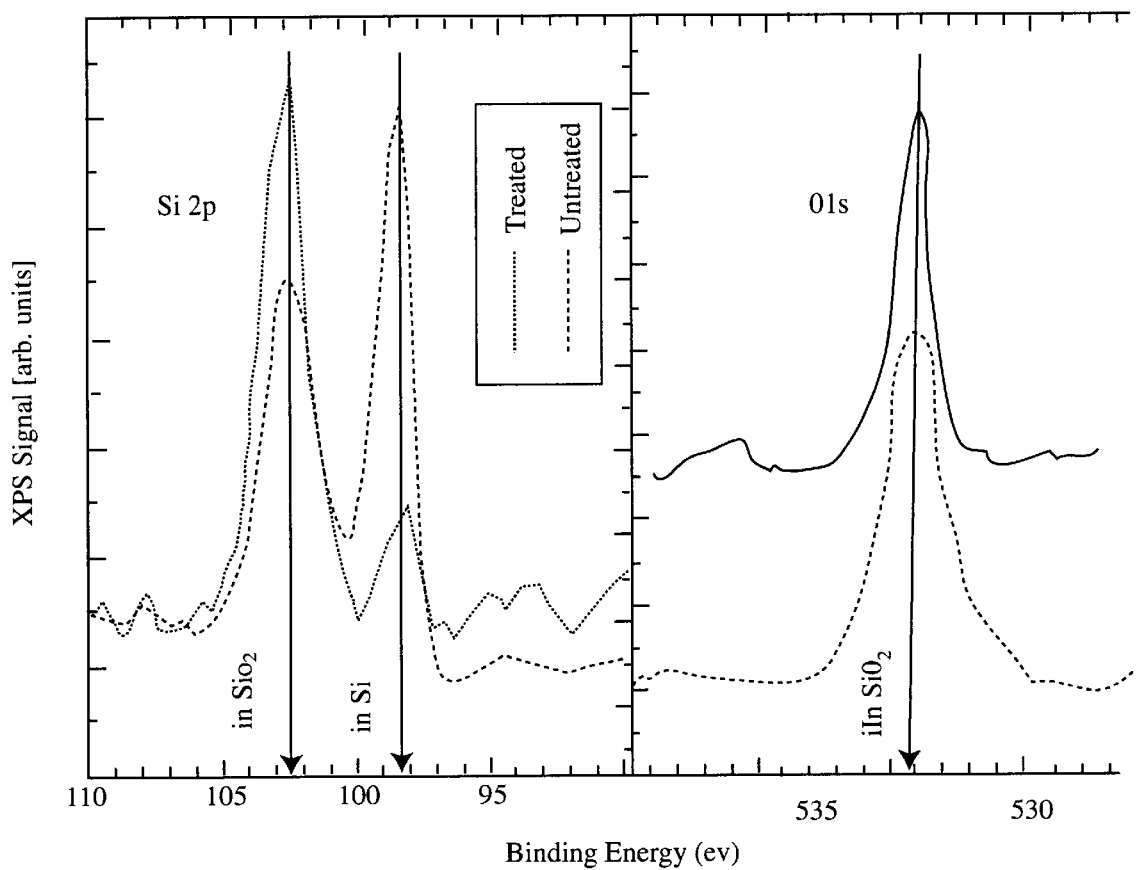
FIG. 6 shows x-ray photoelectron spectroscopy measurements of the multilayer sample used in experiment c) in comparison to an untreated multilayer mirror.

Filling the vacuum chamber with 133 Pa of helium changes the appearance of the plasma. A bright red colored halo can be observed around the original plasma whereas the plasma in vacuum appears in a blue color. This provides the interaction of particles from the plasma with the helium atoms. The gradient of the decreasing reflectivity is increased compared to the cases a) and b) and the reflectivity is measured to zero after about $2.5 \times 10^5$ pulses. Visual analysis of the multilayer sample does not show the stripes described above, but a change in color of the surface of the mirror is observed. X-ray photoelectron spectroscopy (XPS) analysis of the surface shows a higher oxidation degree in the treated areas compared to the untreated surface region. FIG. 6 shows X-ray photoelectron spectroscopy measurements of the multilayer sample used in this experiment c) in comparison to an untreated multilayer mirror. Only the regions of the silicon and oxygen related regions of the spectrum are shown.

The silicon 2 p signal of the untreated sample shows a higher contribution from silicon compared to silicon oxide. In the signal achieved from the treated sample, this ratio changes. In this case not only the surface layers of silicon are oxidized but also silicon layers below. On both samples no signal contribution from molybdenum can be seen. The decreasing reflectivity of the multilayer mirror can not be explained by sputtering effects. The oxygen ion energy is probably decreased by interaction with helium atoms to values below the sputtering threshold (see below). This leads to an oxidation of the multilayer mirror also in lower atomic layers, which alters the period thickness and the transmission of the spacer layers. Both result in a decreased reflectivity. Further experiments are necessary to understand the effect in detail, for example a transmission electron microscope analysis of the multilayer sample.

d) Repeller Field

The electron temperature of the plasma is shown in earlier publications to be several 10 eV (see Jin,F., Richardson, M., "New Laser Plasma Source For Extreme-ultraviolet Lithography". Appl. Optics 34, 5750–5760 (1995)). The ion energies in the plasma are estimated to be in the same range. A bias voltage of +100 V is supplied to the mirror to reflect the ions. The plot in FIG. 5 shows a smaller gradient of the decreasing reflectivity provided by the repeller field d) compared to a)–c). Thus, FIG. 5 shows the distinct advantage provided by the repeller field on the reflectivity of multilayer mirrors exposed by the radiation and debris from the plasma using the different debris shields described in the text.

FIG. 6 shows x-ray photoelectron spectroscopy measurements of the multilayer sample used in experiment c) in comparison to an untreated multilayer mirror. Only the regions of the silicon and oxygen related regions of the spectrum are shown.

Sputter Considerations

Sputtering effects from neutrals or electrons, which are accelerated by the bias voltage, are still remaining. Visual analysis shows the same effect of sputtered bilayers from the mirror described in a). Analysis with a scanning electron microscope show that 16 periods are sputtered off after $9 \times 10^6$ shots. Sputtering off a complete multilayer mirror consisting of 10 periods (like the samples used in cases a) to c)) should need $5.6 \times 10^6$ pulses. This is an improvement by a factor of 7 compared to case a) where no debris shield was used.

Figure 7:
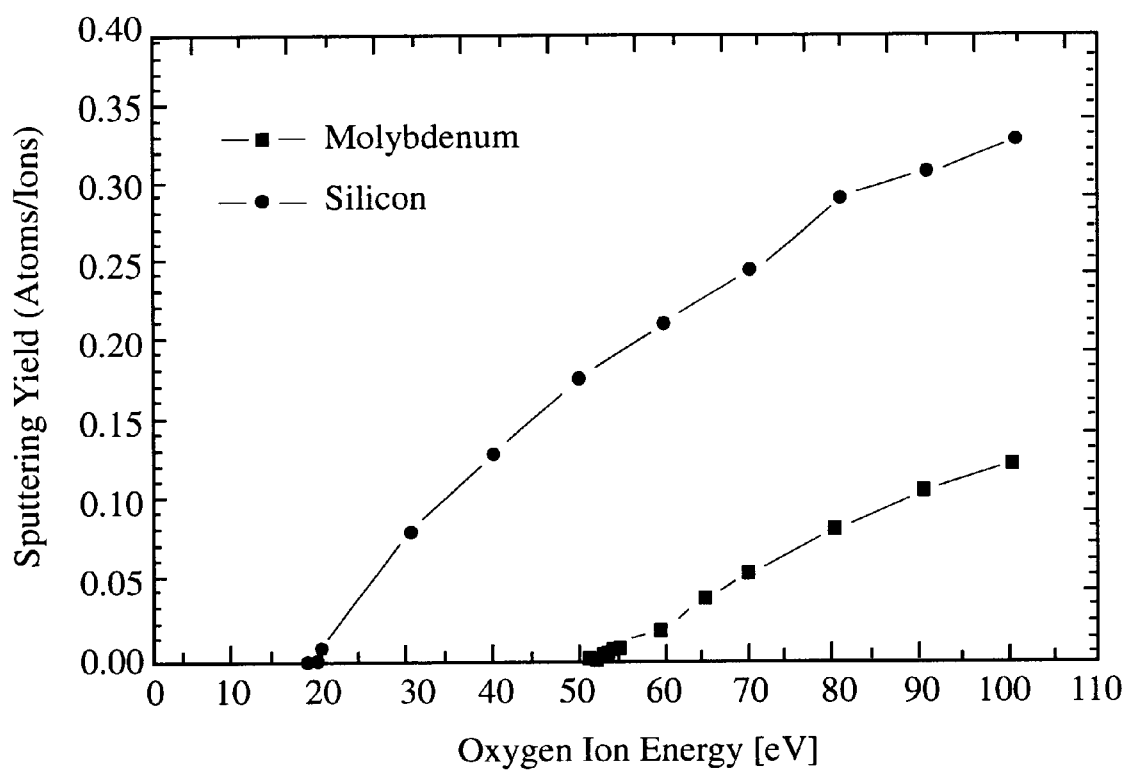
FIG. 7 shows graphs of sputtering yields for molybdenum and silicon plotted against oxygen ion energies provided by the laser produced water plasma.

The laser produced plasma is an emitter of neutrals and charged particles. Assuming a droplet size of 57 $\mu$m in diameter, the droplet contains $3.2 \times 10^{15}$ water molecules. This is the droplet size for a 40 kHz droplet frequency, where the experiments are carried out. In the following considerations, the droplet is completely evaporated and $3.2 \times 10^{15}$ oxygen ions are emitted homogenous into a solid angle of $4\pi$sr. The sputtering yields shown in FIG. 7 are calculated using the Monte Carlo method (TRIM code[i]). The sputtering yields are calculated for oxygen ions in dependence on the ion energy sputtering solid silicon and molybdenum. The sputtering thresholds for the oxygen ions are calculated to 20 eV for solid silicon and 52 eV for solid molybdenum, respectively.

The multilayer mirror under investigation in case a) has 10 bilayers with 9.89 nm thickness each. The whole layer stack consists of $2.95 \times 10^{17}$ atoms/cm$^2$ of silicon and $2.53 \times 10^{17}$ atoms/cm$^2$ of molybdenum, assuming a $\Gamma$ factor of $d_{Mo}/d_{Si}=0.66$. The mirror, positioned in a distance of 32 mm to the plasma, covers a solid angle of $9.76 \times 10^{-2}$ sr/cm$^2$. The ion flux is then $2.5 \times 10^{13}$/(cm$^2$pulse) at the surface of the mirror. An average oxygen ion energy of 60 eV leads to a sputtering yield of $2 \times 10^{-2}$ atoms/ion for the molybdenum layers and 0.2 atoms/ion for the silicon layers. This ion energy of 60 eV is close to the electron energy estimated by the spectral distribution of the radiation and above the sputtering threshold of molybdenum, which is observed experimentally. The total ion flux to sputter off the bilayers completely can be calculated using this value to $1.4 \times 10^{19}$/cm$^2$. Considering the solid angle of the multilayer this leads to a number of $1.8 \times 10^{21}$ ions from the source, or, using the calculations above, $5.7 \times 10^5$ pulses. This value is close to the measured number of $7 \times 10^5$ pulses in case a) without any debris shield. Sputtering from hydrogen ions and electrons is not considered in these calculations, because it can be neglected for hydrogen ions with the same kinetic energy compared to the oxygen ions.

Conclusion

The laser produced plasma using a water droplet target has been investigated in detail. The conversion efficiency for radiation with 13 nm wavelength emitted by the lithium-like oxygen is measured to 0.63%/$4\pi$sr. For the demands of EUV lithography, it can be estimated that a laser with a higher repetition rate is needed. A 50 kHz Nd:YAG laser with 200 mJ pulse energy, which drives the described source, will fulfill the 30–60 W output power in narrowband line radiation of lithium-like oxygen at 13 nm wavelength. The target technology itself offers the possibility for repetition rates up to 100 kHz.

The reflectivity of the multilayer mirrors exposed with radiation and treated by particles from the described source is decreased with the number of pulses. This effect can be explained by observed sputtering effects caused by the oxygen ions, neutrals and electrons from the plasma. A Monte Carlo model is used to estimate the quantity of the sputter yield in good agreement with the experimental data. A debris shield in form of a repeller field is demonstrated to reduce the sputter speed by nearly one order of magnitude.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of producing EUV and/or x-rays from a target source comprising the steps of:

continuously feeding frozen water into a target source;

irradiating the target source with a laser;

producing x-rays therefrom for incidence on a reflection mirror; and, an auxilliary electrode system which provides a repeller field that slows down and reverses the trajectory of ions from said source before impaction onto a collection mirror.

2. The method of producing EUV and/or x-rays of claim 1, further comprising the step of:

imposing a dc voltage on said mirror.

3. The method of producing EUV and/or x-rays of claim 2, wherein the dc voltage is 100 volts.

4. The method of producing EUV and/or x-rays of claim 2, wherein the voltage is applied by a battery.

5. The method of producing EUV and/or x-rays of claim 2, wherein the repeller field is enclosed in a helium atmosphere.

6. The method of producing EUV and/or x-rays of claim 1, wherein the repeller field is provided by opposed magnets.

7. The method of producing EUV and/or x-rays of claim 6, wherein the repeller field is enclosed in a gas atmosphere that slows down a oxygen ions from said source.

8. The method of producing EUV and/or x-rays of claim 1, wherein the step of producing further includes producing x-rays of approximately 13 nm.

9. The method of producing EUV and/or x-rays of claim 6, wherein the step of feeding the target source further includes:

continuously feeding the target source at a frequency of approximately 1000 Hz.

10. A method of producing 13 nm soft x-rays utilized in lithography comprising the steps of: forming ice crystals;

irradiating the ice crystals with a light source;

directing 13 nm x-rays from the ice crystals to a collection mirror; and, slowing down the 13 nm x-rays prior to reaching the reflection face of said mirrors with a repeller field.

11. The method of producing 13 nm soft x-rays of claim 10, where the repeller field is provided by a dc voltage placed on said collection mirror.

12. The method of producing 13 nm soft x-rays of claim 11, where the repeller field is provided by a dc voltage of 100 volts.

13. The method of producing 13 nm soft x-rays of claim 10, where the repeller field is positioned in an atmosphere of helium.

14. An apparatus for producing soft x-rays comprising:

a supply of water;

means for freezing the water into crystals;

means for feeding the crystals into a target path;

means for irradiating a laser beam into the target path creating x-rays;

a first collecting mirror for reflecting EUV or x-rays to a lithographic target; and, means for repelling ions from an X-ray source from the surface of said mirror.

15. The apparatus for producing EUV and/or x-rays of claim 14, wherein the means for feeding the crystals further includes:

a high repetition rate liquid-droplet injector.

16. The apparatus for producing EUV and/or x-rays of claim 14, wherein said means for repelling is a dc voltage imposed on said mirror.

17. A pulse based EUV light source based on laser plasmas produced from a train of microscopic water droplets comprising:

an EUV light source;

a first collector EUV mirror; and, an auxiliary electrode system which provides a repeller field that slows down and reverses the trajectory of ions from said source before they impact the collection mirror.

18. The pulse based EUV light source of claim 17 wherein said repeller field is provided by a dc potential imposed on said mirror.

* * * * *